United States Patent
Gao

(10) Patent No.: US 11,145,511 B1
(45) Date of Patent: Oct. 12, 2021

(54) POWER SEMICONDUCTOR DEVICE AND METHOD OF FABRICATING THE SAME

(71) Applicant: Shanghai Huahong Grace Semiconductor Manufacturing Corporation, Shanghai (CN)

(72) Inventor: Xue Gao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/069,367

(22) Filed: Oct. 13, 2020

(30) Foreign Application Priority Data

May 26, 2020 (CN) .......................... 202010457560.5

(51) Int. Cl.
| | |
|---|---|
| *H01L 29/66* | (2006.01) |
| *H01L 21/266* | (2006.01) |
| *H01L 21/265* | (2006.01) |
| *H01L 21/28* | (2006.01) |

(52) U.S. Cl.
CPC ...... *H01L 21/266* (2013.01); *H01L 21/26513* (2013.01); *H01L 21/28132* (2013.01); *H01L 29/66719* (2013.01); *H01L 29/66734* (2013.01)

(58) Field of Classification Search
CPC ............ H01L 21/266; H01L 21/26513; H01L 29/66719; H01L 29/66734; H01L 21/28132; H01L 29/7813; H01L 29/66727; H01L 29/41766; H01L 29/4236
See application file for complete search history.

(56) References Cited

U.S. PATENT DOCUMENTS

| | | | |
|---|---|---|---|
| 10,418,442 B1 * | 9/2019 | Chen | H01L 29/7813 |
| 2011/0233663 A1 * | 9/2011 | Hamada | H01L 29/66666 257/331 |
| 2013/0168760 A1 * | 7/2013 | Hsieh | H01L 29/42368 257/330 |

* cited by examiner

*Primary Examiner* — Mohammed R Alam
(74) *Attorney, Agent, or Firm* — Murtha Cullina LLP

(57) ABSTRACT

A power semiconductor device and a method of fabricating such a power semiconductor device are disclosed. In the method, spacers are formed, which cover sidewalls of a source polysilicon layer and reside on trench portions around the source polysilicon layer. As such, a contact is allowed to be directly formed above the source polysilicon layer, eliminating the need for a special photomask for defining a connection between the contact and the gate electrode, reducing the number of required steps, lowering the process cost and avoiding the risk of contact of the subsequently-formed contact above the source polysilicon layer with a gate polysilicon layer. With the spacers protecting a second oxide layer, during the subsequent formation of a source electrode, the implantation of some n-type ions into the second oxide layer, which may degrade the properties of the second oxide layer, is prevented.

8 Claims, 5 Drawing Sheets

POWER SEMICONDUCTOR DEVICE AND METHOD OF FABRICATING THE SAME

CROSS-REFERENCE TO RELATED APPLICATION

This application claims priority to Chinese patent application number 202010457560.5, filed on May 26, 2020, the entire contents of which are incorporated herein by reference.

TECHNICAL FIELD

The present invention relates to the fabrication of semiconductor integrated circuits and, in particular, to a power semiconductor device and a method of fabricating such a power semiconductor device.

BACKGROUND

The increasing integration of semiconductor devices is bringing integrated circuits therein closer and closer to one another. As a result, for a power semiconductor device, it is difficult to pick up a source polysilicon layer disposed in a split gate trench (SGT) directly by forming a contact above the source polysilicon layer, due to extremely strict alignment and critical dimension (CD) requirements on the formation of such a contact, which necessitate the use of a dedicated photomask for defining a predetermined area A (as shown in FIG. 1a). This hinders further integration of the semiconductor device, and the use of the dedicated photomask raises the manufacturing cost. Additionally, during the formation of a gate polysilicon layer, it tends to occur that the resulting gate polysilicon layer is inconsistent, adversely affecting electrical performance of the power semiconductor device being fabricated.

Therefore, there is a need for a power semiconductor device with enhanced circuit integration, lower fabrication cost and improved electrical performance, as well as a method of fabricating such a power semiconductor device.

SUMMARY OF THE INVENTION

The present invention provides such a power semiconductor device and method.

The provided method includes the steps of:

S1) forming a trench in a semiconductor substrate;

S2) sequentially forming a first oxide layer and a source polysilicon layer over a surface of the semiconductor substrate, with the first oxide layer covering an inner surface of the trench and the source polysilicon layer filling the trench;

S3) sequentially etching a portion of the source polysilicon layer and a portion of the first oxide layer to expose the surface of the semiconductor substrate, with a remaining portion of the source polysilicon layer in the trench protruding beyond the surface of the semiconductor substrate and a remaining portion of the first oxide layer in the trench being recessed beneath the surface of the semiconductor substrate, such that a groove is formed at a top of the trench, the groove exposing sidewalls of a top end of the remaining portion of the source polysilicon layer and exposing a portion of the inner surface of the trench proximate the surface of the semiconductor substrate;

S4) forming a second oxide layer and a gate polysilicon layer, the second oxide layer covering both the exposed portion of the source polysilicon layer and the exposed portion of the inner surface of the trench, the gate polysilicon layer filling the groove and situated over the remaining portion of the first oxide layer, wherein the gate polysilicon layer is recessed beneath the surface of the semiconductor substrate and the gate polysilicon layer has a top surface lower than a top surface of the remaining portion of the source polysilicon layer;

S5) forming spacers over the sidewalls of the top end of the remaining portion of the source polysilicon layer, the spacers situated over the trench; and S6) performing, with the spacers serving as a mask, an implantation process to form a source in the semiconductor substrate adjacent to the trench.

Additionally, step S2 may include:

depositing the first oxide layer, which covers both the surface of the semiconductor substrate and the inner surface of the trench; and forming the source polysilicon layer, which fills the trench and covers the first oxide layer on the surface of the semiconductor substrate.

Additionally, step S3 may include:

performing an initial etching process on the source polysilicon layer to expose the first oxide layer, with the source polysilicon layer still filling the trench and protruding beyond the surface of the semiconductor substrate;

performing an over-etch process on the source polysilicon layer in the trench; and etching a portion of the first oxide layer to expose the surface of the semiconductor substrate, with the inner surface of the trench being partially exposed and the remaining portion of the source polysilicon layer being partially exposed.

Additionally, after the over-etch process, the remaining portion of the source polysilicon layer may protrude beyond the surface of the semiconductor substrate.

Additionally, step S4 may include:

depositing the second oxide layer, which covers the exposed portion of the source polysilicon layer and covers both the exposed portion of the inner surface of the trench and the surface of the semiconductor substrate;

forming the gate polysilicon layer on the second oxide layer, the gate polysilicon layer filling the spaces in the trench above the second oxide layer; and etching the gate polysilicon layer in at least two steps with the second oxide layer serving as a mask, with the etched gate polysilicon layer being recessed beneath the source polysilicon layer.

Additionally, each of the spacers may include a stack of an oxide layer and a silicon nitride layer, or an oxide layer, or a stack of an oxide layer, a nitride layer and an oxide layer.

Additionally, the spacers may surround the exposed portion of the source polysilicon layer and cover the second oxide layer on the inner surface of the trench.

Additionally, step S6 may include:

implanting p-type ions in the semiconductor substrate adjacent to the trench, with the spacers serving as a mask, thereby forming p-type regions in the semiconductor substrate; and implanting n-type ions in the semiconductor substrate adjacent to the trench, with the spacers serving as a mask, thereby forming n-type regions above the respective p-type regions and hence forming the source electrode and the power semiconductor device, wherein a thickness of the n-type regions is equal to a distance between bottoms of the p-type regions to the surface of the semiconductor substrate.

In another aspect of the present invention, there is also provided a power semiconductor device fabricated by the method as defined above.

Compared with the prior art, the present invention offers at least the following advantages:

It provides a power semiconductor device and a method of fabricating such a device. The method includes the steps of: S1) forming a trench in a semiconductor substrate; S2) sequentially forming a first oxide layer and a source polysilicon layer over a surface of the semiconductor substrate, with the first oxide layer covering an inner surface of the trench and the source polysilicon layer filling the trench; S3) sequentially etching a portion of the source polysilicon layer and a portion of the first oxide layer to expose the surface of the semiconductor substrate, with a remaining portion of the source polysilicon layer in the trench protruding beyond the surface of the semiconductor substrate and a remaining portion of the first oxide layer in the trench being recessed beneath the surface of the semiconductor substrate, such that a groove is formed at a top of the trench, the groove exposing sidewalls of a top end of the remaining portion of the source polysilicon layer and exposing a portion of the inner surface of the trench proximate the surface of the semiconductor substrate; S4) forming a second oxide layer and a gate polysilicon layer, the second oxide layer covering both the exposed portion of the source polysilicon layer and the exposed portion of the inner surface of the trench, the gate polysilicon layer filling the groove and situated over the remaining portion of the first oxide layer, wherein the gate polysilicon layer is recessed beneath the surface of the semiconductor substrate and the gate polysilicon layer has a top surface lower than a top surface of the remaining portion of the source polysilicon layer; S5) forming spacers over the sidewalls of the top end of the remaining portion of the source polysilicon layer, the spacers situated over the trench; and S6) performing, with the spacers serving as a mask, an implantation process to form a source in the semiconductor substrate adjacent to the trench. According to the present invention, forming the spacers allow a contact to be directly formed above the source polysilicon layer, eliminating the need for a special photomask for defining a connection between the contact and the gate electrode, reducing the number of required steps, lowering the process cost, and avoiding the risk of contact of the subsequently-formed contact above the source polysilicon layer with the gate polysilicon layer. With the spacers protecting the second oxide layer, during the subsequent formation of the source electrode, the implantation of some n-type ions into the second oxide layer, which may degrade the properties of the second oxide layer, is prevented. Moreover, since no n-type ions are implanted into second oxide layer, the diffusion of such ions downward into the p-type regions via excessively thinned portions of the second oxide layer, which may avoid the effect on the channel, increase the threshold voltage of the power semiconductor device being fabricated and improve the electrical performance of the power semiconductor device.

BRIEF DESCRIPTION OF THE DRAWINGS

In FIGS. 1a to 1c: A—predetermined area; B—gate oxide portion; a—groove defect; 1—gate oxide; 2—source polysilicon layer; 3—gate poly.

In FIGS. 3a to 3f: 100—semiconductor substrate; 110—trench; 120—first oxide layer; 130—source polysilicon layer; 140—second oxide layer; 150—gate polysilicon; 200—spacer; 300—source electrode; 310—p-type region; 320—n-type region.

DETAILED DESCRIPTION

Figure 1A:
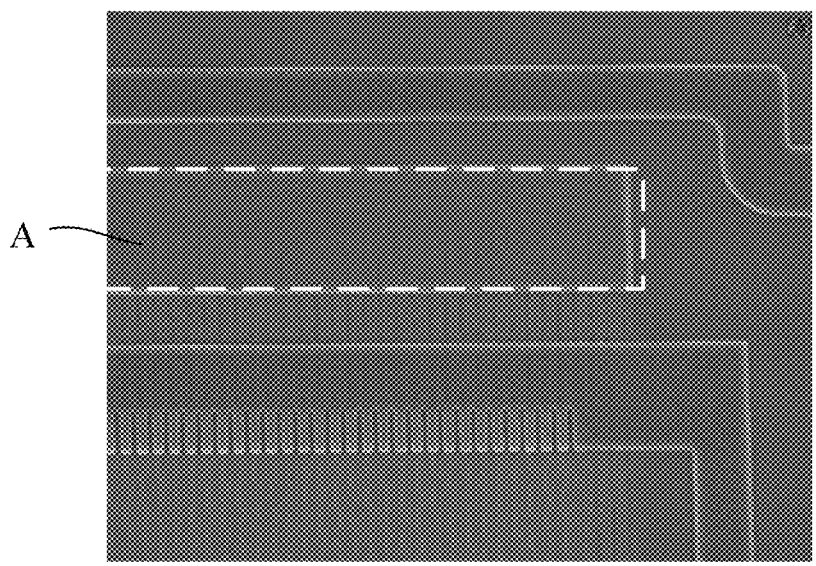
FIGS. 1a to 1c are schematic diagrams of a conventional power semiconductor device.
Figure 1B:
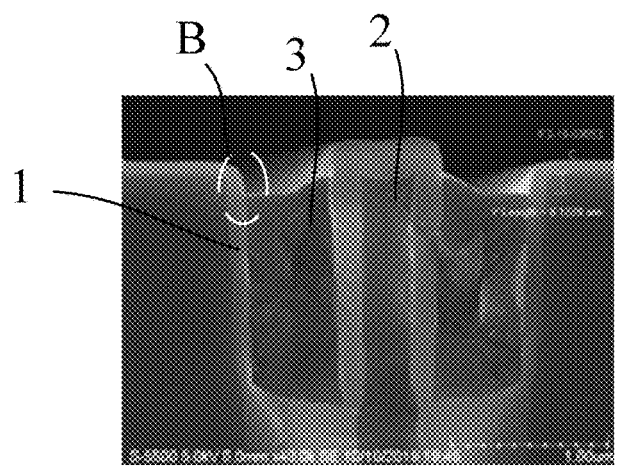
Figure 1C:
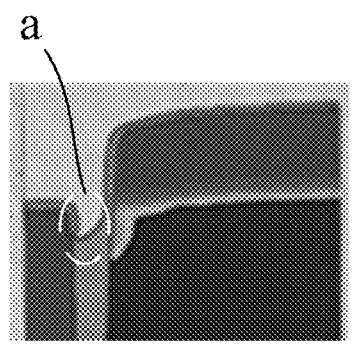

As discussed in the Background section, during the formation of a gate polysilicon layer in a power semiconductor device, the problem of inconsistency of the resulting gate polysilicon layer tends to occur due to limitations of the current fabrication technology. Such inconsistency lies in a non-uniform degree of over-etch across the gate polysilicon layer, as shown in FIG. 1b, tending to result in an excessively thinned portion B of a gate oxide 1 for the gate polysilicon layer 3 on the side thereof away from a source polysilicon layer 2. More specifically, as shown in FIG. 1c, a longitudinal groove defect a may appear in the portion B of the gate oxide 1. Due to the presence of such a groove defect a, during an ion implantation process for forming a source electrode (which involves forming a p-doped region by implanting p-type ions and then forming an n-doped region above the p-doped region by implanting n-type ions), some of the n-type ions may be implanted into the gate oxide 1, degrading the properties of the gate oxide 1. Moreover, some of these n-type ions may further diffuse from the gate oxide 1 downward into the p-doped region. This will adversely affect a channel, lowering a threshold voltage of the power semiconductor device being fabricated and deteriorating electrical performance of the power semiconductor device.

This is overcome by the present invention through forming spacers, which allow a contact to be directly formed above the source polysilicon layer, eliminating the need for a special photomask for defining a connection between the contact and the gate electrode, reducing the number of required steps, lowering the process cost, and avoiding the risk of contact of the subsequently-formed contact above the source polysilicon layer with the gate polysilicon layer. With the spacers protecting the gate polysilicon layer, during the implantation process in the aforementioned step, diffusion of ions into the gate polysilicon layer via excessively thinned portions in a second oxide layer is prevented, thereby avoiding the effect on the channel, increasing a threshold voltage of the power semiconductor device being fabricated and improving the electrical performance of the power semiconductor device.

The power semiconductor device and method provided in the present invention will be described in greater detail below with reference to the accompanying drawings, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

For the sake of clarity, not all features of the specific embodiments are described. Additionally, in the following description, well-known functions and structures are not described in detail to avoid unnecessarily obscuring the invention. The development of any specific embodiment of the present invention includes specific decisions made to achieve the developer's specific goals, such as compliance with system related and business-related constraints, which will vary from one implementation to another. Moreover, such a development effort might be complex and time-consuming but would nevertheless be a routine undertaking for those of ordinary skill in the art.

Features and advantages of the invention will be more apparent from the following detailed description of specific embodiments, which is to be read in conjunction with the accompanying drawings. Note that the figures are provided in a very simplified form not necessarily presented to scale, with their only intention is to facilitate convenience and clarity in explaining the disclosed embodiments.

Figure 2:
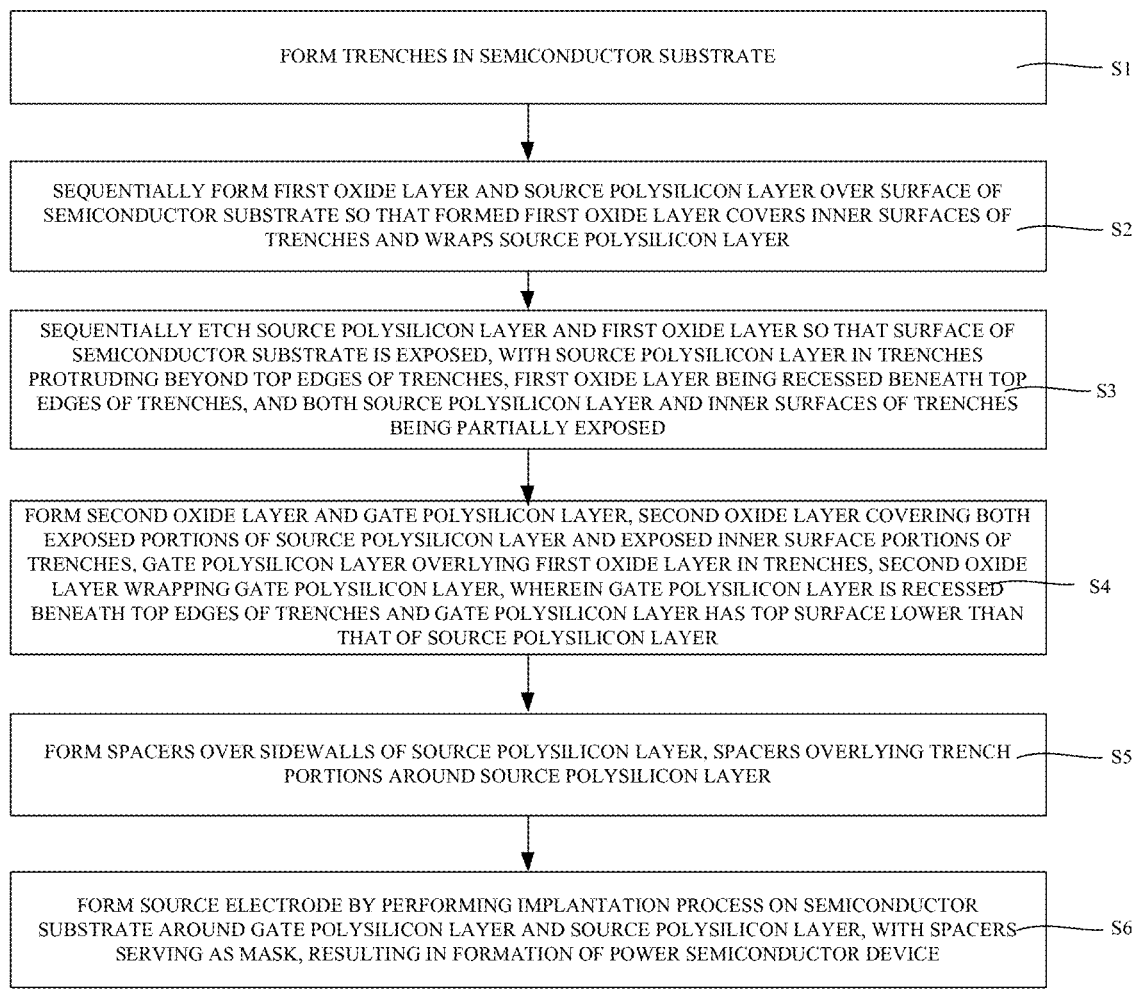
FIG. 2 is a schematic flow diagram illustrating a method of fabricating a power semiconductor device according to an embodiment of the present invention.

FIG. 2 is a schematic flow diagram illustrating a method of fabricating a power semiconductor device according to an embodiment of the present invention. As shown, the method includes the steps of:

S1) forming a number of trenches in a semiconductor substrate;

S2) sequentially forming a first oxide layer and a source polysilicon layer over a surface of the semiconductor substrate, with the first oxide layer covering inner surfaces of the trenches and the source polysilicon layer filling the trenches;

S3) sequentially etching a portion of the source polysilicon layer and a portion of the first oxide layer to expose the surface of the semiconductor substrate, with the remaining portion of the source polysilicon layer in the trenches protruding beyond the surface of the semiconductor substrate, the remaining portion of the first oxide layer in the trenches being recessed beneath the surface of the semiconductor substrate, such that a groove is formed at a top of the trench, the groove exposing sidewalls of a top end of the remaining portion of the source polysilicon layer and exposing a portion of the inner surface of the trench proximate the surface of the semiconductor substrate;

S4) forming a second oxide layer and a gate polysilicon layer, the second oxide layer covering both the exposed portion of the source polysilicon layer and the exposed portion of the inner surface of the trenches, the gate polysilicon layer filling the groove and situated over the remaining portion of the first oxide layer, wherein the gate polysilicon layer is recessed beneath the surface of the semiconductor substrate and the gate polysilicon layer has a top surface lower than a top surface of the remaining portion of the source polysilicon layer;

S5) forming spacers over the sidewalls of the top end of the remaining portion of the source polysilicon layer, the spacers situated over the trenches; and S6) performing, with the spacers serving as a mask, an implantation process to form a source in the semiconductor substrate adjacent to the trenches.

The method according to this embodiment will be described in greater detail below with reference to FIGS. 2 to 3f.

Figure 3A:
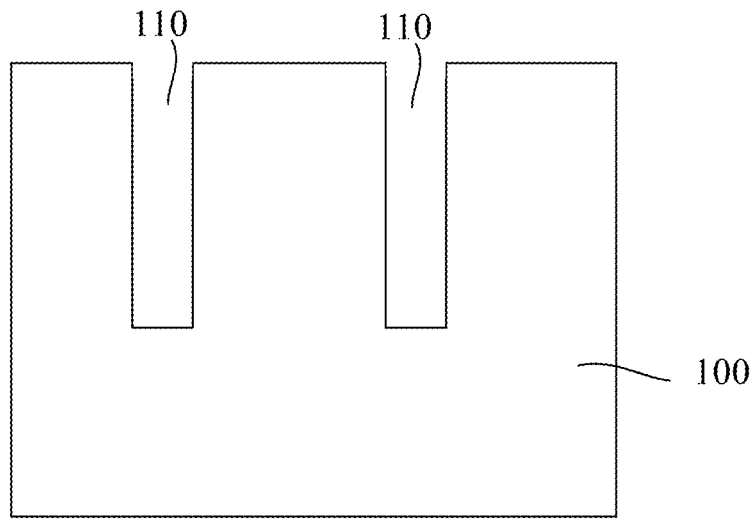
FIGS. 3a to 3f are schematic diagrams of structures resulting from steps in a method of fabricating a power semiconductor device according to an embodiment of the present invention.

As shown in FIG. 3a, in step S1, a number of trenches 110 are formed in a semiconductor substrate 100. The trenches 110 neighbor one another. Specifically, the trenches 110 may neighbor, and being parallel to, one another. In other words, the neighboring trenches 110 may extend in parallel to one another in the same direction. Each of the trenches 110 may have an elongate shape, in particular, for example, a rectangular shape or a shape tapered from the middle to both ends. While this embodiment is described with two such trenches being formed in the semiconductor substrate as an example, in practice, more or less such trenches may also be formed in the semiconductor substrate.

Figure 3B:
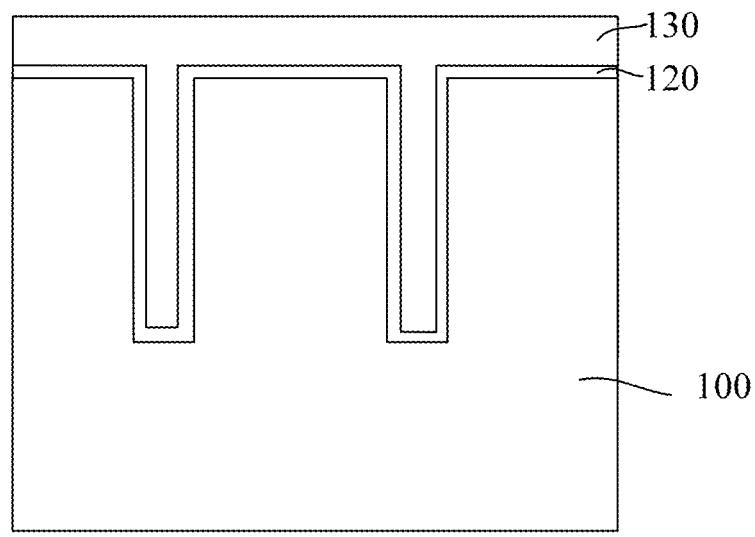

As shown in FIG. 3b, in step S2, a first oxide layer 120 and a source polysilicon layer 130 are sequentially formed over a surface of the semiconductor substrate 100. The first oxide layer 120 covers inner surfaces of the trenches 110 and the source polysilicon layer 130 fills the trenches.

Specifically, this step may include the steps as detailed below.

First of all, the first oxide layer 120 is deposited, which covers both the surface of the semiconductor substrate 100 and the inner surfaces of the trenches 110. The first oxide layer 120 over the inner surfaces of the trenches 110 may have a uniform thickness, for example, in the range of 3000-6000 Å.

Subsequently, the source polysilicon layer 130 is formed, which fills the trenches 110 and covers the first oxide layer 120 on the surface of the semiconductor substrate 100. As a result, different portions of a top surface of the source polysilicon layer 130 over the trenches 110 and the surface of the semiconductor substrate 100 are substantially flush with one another. In addition, the source polysilicon layer 130 covers the first oxide layer 120.

Figure 3C:
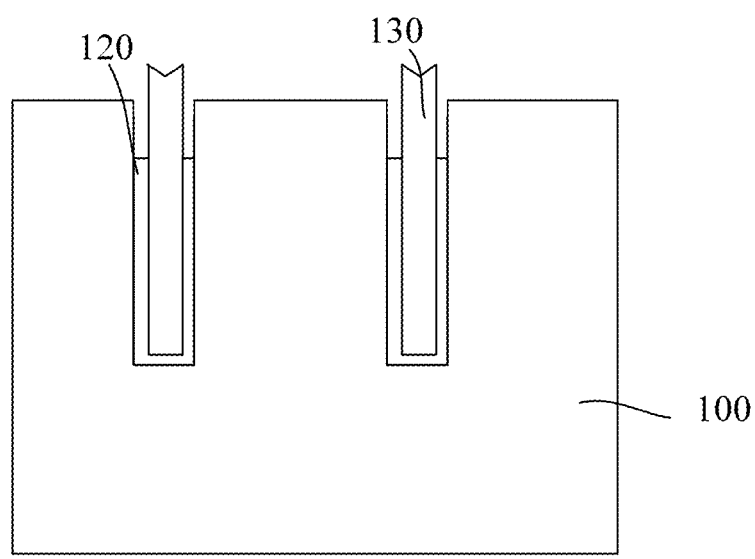

As shown in FIG. 3c, in step S3, the source polysilicon layer 130 and the first oxide layer 120 are sequentially etched to expose the surface of the semiconductor substrate 100. As a result, the remaining portion of the source polysilicon layer 130 in the trenches 110 protrudes beyond top edges of the trenches 110, with the remaining portion of the first oxide layer 120 being recessed beneath the top edges of the trenches 110. Additionally, both the source polysilicon layer 130 and the inner surfaces of the trenches 110 are partially exposed.

Specifically, this step may include the steps as detailed below.

First of all, the source polysilicon layer 130 is etched, so that the first oxide layer 120 is exposed, with the trenches 110 being still filled by the source polysilicon layer 130. In addition, the source polysilicon layer 130 in the trenches 110 protrudes beyond the top edges of the trenches 110.

Next, an over-etch process is performed on the source polysilicon layer 130 in the trenches 110. This over-etch process may last for a period of time that is shorter than a conventional over-etch process for processing such a source polysilicon layer. As a result of this over-etch process, the source polysilicon layer 130 in the trenches 110 still protrudes beyond the surface of the semiconductor substrate 100 and thus the top edges of the trenches 110.

Afterward, the first oxide layer 120 is etched so that the surface of the semiconductor substrate 100 is exposed. In addition, portions of the first oxide layer 120 on the inner surfaces of the trenches 110 are also etched, portions of the inner surfaces of the trenches 110 and hence additional portions of the source polysilicon layer 130 opposite thereto are also exposed. As a result, an exposed length of the source polysilicon layer 130 is greater than that of the inner surfaces of the trenches 110, and the first oxide layer 120 is recessed beneath the top edges of the trenches 110.

Figure 3D:
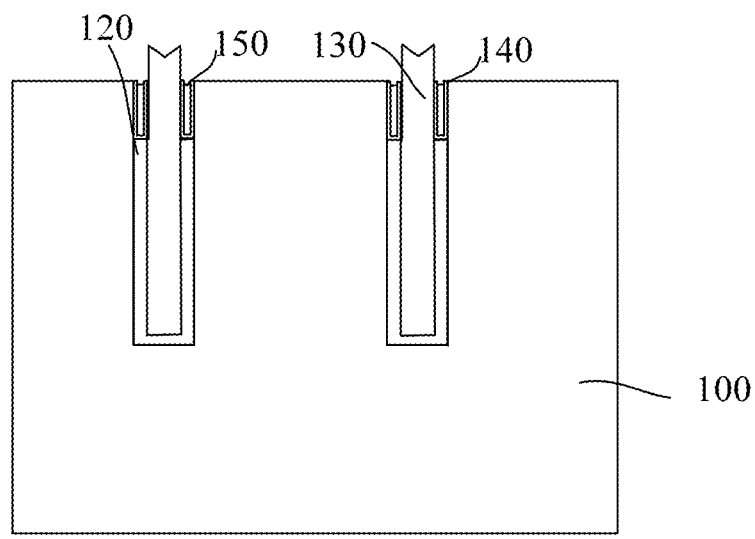

As shown in FIG. 3d, in step S4, a second oxide layer 140 and a gate polysilicon layer 150 are formed. The second oxide layer 140 covers the exposed surface portions of the source polysilicon layer 130 and the exposed portion of the inner surface of the trenches 110. The gate polysilicon layer 150 is formed above the first oxide layer 120 in the trenches 110, and the second oxide layer 140 surrounds the gate polysilicon layer 150. Additionally, the gate polysilicon layer 150 has a top surface lower than that of the source polysilicon layer 130.

Specifically, this step may include the steps as detailed below.

First of all, the second oxide layer 140 is deposited, which covers the exposed portion of the source polysilicon layer 130 and covers the exposed portion of the inner surface of the trenches 110 and the surface of the semiconductor substrate 100. The second oxide layer 140 overlying the first oxide layer 120 is recessed beneath the top edges of the trenches 110.

Next, the gate polysilicon layer 150 is formed on the second oxide layer 140, which fills the spaces above the second oxide layer 140 in the trenches 110.

Subsequently, with the second oxide layer 140 serving as a mask, the gate polysilicon layer 150 is etched in at least two steps (an initial-etch step and an over-etch step) so that the top surface of the etched gate polysilicon layer 150 is lower than that of the source polysilicon layer 130. Moreover, the top surface of the etched gate polysilicon layer 150 is also lower than the top edges of the trenches 110. In this step, it is assumed that the gate polysilicon layer 150 has an inconsistent degree of over-etch resulting from the over-etch process, with the second oxide layer 140 that is located external to both the source polysilicon layer 130 and the gate polysilicon layer 150 and exposed to the used etchant being excessively thinned.

Figure 3E:
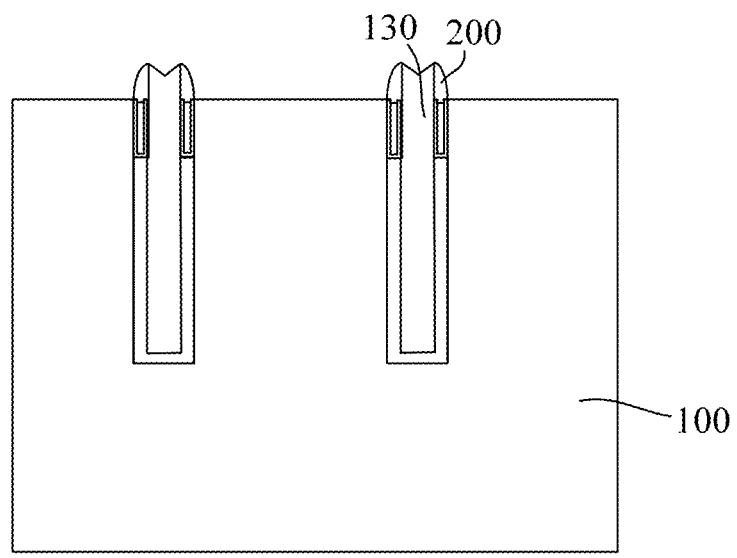

As shown in FIG. 3e, in step S5, spacers 200 are formed over sidewalls of the top end of the remaining portion of the source polysilicon layer 130. In addition, the spacers 200 are formed above the trench portions around the source polysilicon layer 130.

Each spacer 200 may include an oxide-silicon nitride stack, an oxide layer, or an oxide-nitride-oxide (ONO) stack. The spacers 200 are formed over the sidewalls of the top end of the remaining portion of the source polysilicon layer 130 and cover the second oxide layer 140 over the inner surfaces of the trenches 110, thus protecting the second oxide layer 140 by remedying the excessively thinned portions thereof external to the source polysilicon layer 130 and the gate polysilicon layer 150. With the formed spacers 200, a contact may be directly formed above the source polysilicon layer 130, eliminating the need for a special photomask for defining a connection between the contact and the gate electrode, reducing the number of required steps, lowering the process cost, and avoiding the risk of contact of the subsequently-formed contact above the source polysilicon layer 130 with the gate polysilicon layer 150.

Figure 3F:
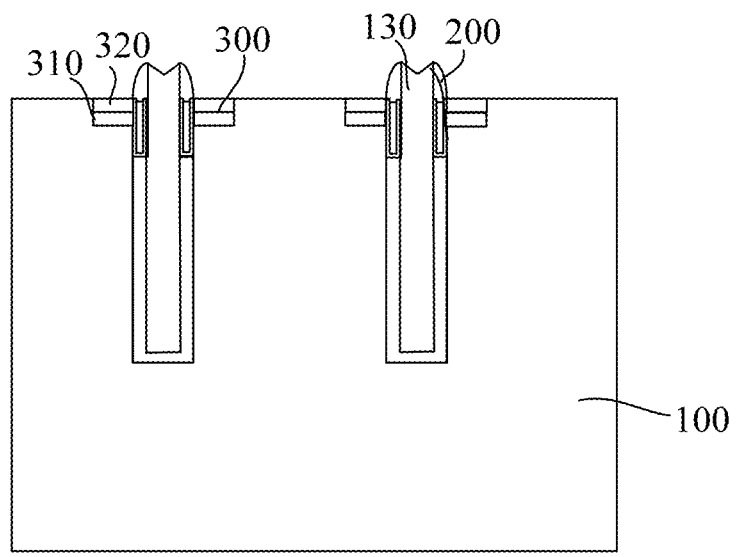

As shown in FIG. 3f, in step S6, with the spacers 200 serving as a mask, forming a source electrode 300 by performing an implantation process on the semiconductor substrate 100 around the gate polysilicon layer 150 and the source polysilicon layer 130, resulting in the formation of the power semiconductor device.

At first, with the spacers 200 serving as a mask, p-type ions are implanted into the semiconductor substrate 100 around the gate polysilicon layer 150 and the source polysilicon layer 130 to form p-type regions 310 in the semiconductor substrate, whose bottoms are spaced from the surface of the semiconductor substrate 100 by a distance.

Next, still with the spacers 200 as a mask, n-type ions are implanted into the semiconductor substrate 100 around the gate polysilicon layer 150 and the source polysilicon layer 130 to form n-type regions 320 above the respective p-type regions 310. The n-type regions 320 have a thickness that is equal to the distance between the bottoms of the p-type regions 310 and the surface of the semiconductor substrate 100. As a result, the source electrode 300 is formed, resulting in the formation of the power semiconductor device.

In this step, with the spacers 200 protecting the gate polysilicon layer 150, the implantation of some n-type ions into the second oxide layer, which may degrade the properties of the second oxide layer, is prevented. Moreover, since no n-type ions are implanted into second oxide layer 140, the diffusion of such ions downward into the p-type regions via the excessively thinned portions of the second oxide layer 140 formed in step S4, which may avoid the effect on the channel, increase the threshold voltage of the power semiconductor device being fabricated and improve the electrical performance of the power semiconductor device. The p- and n-type ions implanted in this step are well known in the art, and a detailed description thereof is therefore deemed unnecessary.

In an embodiment of the present invention, there is also provided a power semiconductor device fabricated using the method as defined above. As shown in FIG. 3f, the power semiconductor device includes: a semiconductor substrate; a number of trenches formed in the semiconductor substrate; a first oxide layer and a second oxide layer, both formed in the trenches, the first oxide layer covers inner surface portions of the trenches; and a source polysilicon layer internal to the first oxide layer, the source polysilicon layer protruding beyond top edges of the trenches, the source polysilicon layer filling the trenches. The second oxide layer rests on the first oxide layer and covers the rest portions of the trenches' inner surface portions and of the source polysilicon layer that are not covered by the first oxide layer. In addition, a gate polysilicon layer is formed on the second oxide layer on the first oxide layer and is recessed beneath the source polysilicon layer. Further, spacers are formed on sidewalls of the source polysilicon layer so that they reside on the gate polysilicon layer. In addition, a source electrode is formed in the semiconductor substrate around the spacers (around the source polysilicon layer and the gate polysilicon layer).

In summary, the present invention provides a power semiconductor device and a method of fabricating such a device. The method includes the steps of: S1) forming a trench in a semiconductor substrate; S2) sequentially forming a first oxide layer and a source polysilicon layer over a surface of the semiconductor substrate, with the first oxide layer covering an inner surface of the trench and the source polysilicon layer filling the trench; S3) sequentially etching a portion of the source polysilicon layer and a portion of the first oxide layer to expose the surface of the semiconductor substrate, with a remaining portion of the source polysilicon layer in the trench protruding beyond the surface of the semiconductor substrate and a remaining portion of the first oxide layer in the trench being recessed beneath the surface of the semiconductor substrate, such that a groove is formed at a top of the trench, the groove exposing sidewalls of a top end of the remaining portion of the source polysilicon layer and exposing a portion of the inner surface of the trench proximate the surface of the semiconductor substrate; S4) forming a second oxide layer and a gate polysilicon layer, the second oxide layer covering both the exposed portion of the source polysilicon layer and the exposed portion of the inner surface of the trench, the gate polysilicon layer filling the groove and situated over the remaining portion of the first oxide layer, wherein the gate polysilicon layer is recessed beneath the surface of the semiconductor substrate and the gate polysilicon layer has a top surface lower than a top surface of the remaining portion of the source polysilicon layer; S5) forming spacers over the sidewalls of the top end of the remaining portion of the source polysilicon layer, the spacers situated over the trench; and S6) performing, with the spacers serving as a mask, an implantation process to form a source in the semiconductor substrate adjacent to the trench. According to the present invention, forming the spacers allow a contact to be directly formed above the source polysilicon layer, eliminating the need for a special photomask for defining a connection between the contact and the gate electrode, reducing the number of required steps, lowering the process cost, and avoiding the risk of contact of the subsequently-formed contact above the source polysilicon layer with the gate polysilicon layer. With the spacers protecting the second oxide layer, during the subsequent formation of the source electrode, the implantation of some n-type ions into the second oxide layer, which may degrade the properties of the second oxide layer, is prevented. Moreover, since no n-type ions are implanted into second oxide layer, the diffusion of such ions downward into the p-type regions via excessively thinned portions of the second oxide layer, which may avoid the effect on the channel, increase the threshold voltage of the power semiconductor device being fabricated and improve the electrical performance of the power semiconductor device.

It is to be noted that, as used herein, the terms "first", "second" and the like are only meant to distinguish various components, elements, steps, etc. from each other rather than necessarily indicate logical or sequential orderings thereof, unless otherwise indicated or specified.

It will be appreciated that, while the invention has been described with reference to several preferred embodiments, it is not intended to be limited to these embodiments in any way. In light of the teachings hereinabove, any person of skill in the art may make various possible variations and changes to the disclosed embodiments or modify them into equivalent alternatives, without departing from the scope of the invention. Accordingly, any and all such simple variations, equivalent alternatives and modifications made to the foregoing embodiments without departing from the scope of the invention are intended to fall within the scope thereof

What is claimed is:

1. A method of fabricating a power semiconductor device, comprising the steps of: S1) forming a trench in a semiconductor substrate; S2) sequentially forming a first oxide layer and a source polysilicon layer over a surface of the semiconductor substrate, with the first oxide layer covering an inner surface of the trench and the source polysilicon layer filling the trench; S3) sequentially etching a portion of the source polysilicon layer and a portion of the first oxide layer to expose the surface of the semiconductor substrate, with a remaining portion of the source polysilicon layer in the trench protruding beyond the surface of the semiconductor substrate and a remaining portion of the first oxide layer in the trench being recessed beneath the surface of the semiconductor substrate, such that a groove is formed at a top of the trench, the groove exposing sidewalls of a top end of the remaining portion of the source polysilicon layer and exposing a portion of the inner surface of the trench proximate the surface of the semiconductor substrate; S4) forming a second oxide layer and a gate polysilicon layer, the second oxide layer covering both the exposed portion of the source polysilicon layer and the exposed portion of the inner surface of the trench, the gate polysilicon layer filling the groove and situated over the remaining portion of the first oxide layer, wherein the gate polysilicon layer is recessed beneath the surface of the semiconductor substrate and the gate polysilicon layer has a top surface lower than a top surface of the remaining portion of the source polysilicon layer; S5) forming spacers over the sidewalls of the top end of the remaining portion of the source polysilicon layer, the spacers situated over the trench; and S6) performing, with the spacers serving as a mask, an implantation process to form a source electrode in the semiconductor substrate adjacent to the trench.

2. The method of claim 1, wherein step S2 comprises:
depositing the first oxide layer, which covers both the surface of the semiconductor substrate and the inner surface of the trench; and
forming the source polysilicon layer, which fills the trench and covers the first oxide layer on the surface of the semiconductor substrate.

3. The method of claim 2, wherein step S3 comprises:
performing an initial etching process on the source polysilicon layer to expose the first oxide layer, with the source polysilicon layer still filling the trench and protruding beyond the surface of the semiconductor substrate;
performing an over-etch process on the source polysilicon layer in the trench; and
etching a portion of the first oxide layer to expose the surface of the semiconductor substrate, with the inner surface of the trench being partially exposed and the remaining portion of the source polysilicon layer being partially exposed.

4. The method of claim 3, wherein after the over-etch process, the remaining portion of the source polysilicon layer protrudes beyond the surface of the semiconductor substrate.

5. The method of claim 4, wherein step S4 comprises:
depositing the second oxide layer, which covers the exposed portion of the source polysilicon layer and covers both the exposed portion of the inner surface of the trench and the surface of the semiconductor substrate;
forming the gate polysilicon layer on the second oxide layer, the gate polysilicon layer filling the spaces in the trench above the second oxide layer; and
etching the gate polysilicon layer in at least two steps with the second oxide layer serving as a mask, with the etched gate polysilicon layer being recessed beneath the source polysilicon layer.

6. The method of claim 5, wherein each of the spacers comprises a stack of an oxide layer and a silicon nitride layer, or an oxide layer, or a stack of an oxide layer, a nitride layer and an oxide layer.

7. The method of claim 6, wherein the spacers surround the exposed portion of the source polysilicon layer and cover the second oxide layer on the inner surface of the trench.

8. The method of claim 7, wherein step S6 comprises:
implanting p-type ions in the semiconductor substrate adjacent to the trench, with the spacers serving as a mask, thereby forming p-type regions in the semiconductor substrate; and
implanting n-type ions in the semiconductor substrate adjacent to the trench, with the spacers serving as a mask, thereby forming n-type regions above the respective p-type regions and hence forming the source electrode and the power semiconductor device, wherein a thickness of the n-type regions is equal to a distance between bottoms of the p-type regions to the surface of the semiconductor substrate.

* * * * *